United States Patent [19]

Sakai et al.

[11] Patent Number: 4,573,161
[45] Date of Patent: Feb. 25, 1986

[54] SEMICONDUCTOR LASER

[75] Inventors: Kazuo Sakai, Tokyo; Yuichi Matsushima, Tokorozawa; Shigeyuki Akiba, Tokyo; Katsuyuki Utaka, Musashino, all of Japan

[73] Assignee: Kokusai Denshin Denwa Kabushiki Kaisha, Tokyo, Japan

[21] Appl. No.: 556,294

[22] Filed: Nov. 30, 1983

[30] Foreign Application Priority Data

Jul. 12, 1982 [JP] Japan ................................. 57-213303

[51] Int. Cl.$^4$ ................................................ H01S 3/19
[52] U.S. Cl. .......................................... 372/45; 357/17
[58] Field of Search ...................... 372/44, 45; 357/17, 357/16

[56] References Cited

FOREIGN PATENT DOCUMENTS 0152178 9/1982 Japan ..................................... 372/45

Primary Examiner—James W. Davie
Attorney, Agent, or Firm—Robert E. Burns; Emmanuel J. Lobato; Bruce L. Adams

[57] ABSTRACT

A semiconductor laser, in which layers on both sides of the light emitting region are each formed by laminating a plurality of semiconductor layers of different energy band gaps and thicknesses smaller than 0.03 μm. The thickness of the thin film layer of at least one kind of the semiconductor thin film layers of a thickness less than 0.03 μm varies in dependence upon the layers remoteness from the light emitting region. The light emitting region and the layers on both sides of the light emitting region are each formed of a mixed crystal which consists of indium, gallium, arsenic and phosphorus, or indium, gallium, aluminum and arsenic and which has a lattice constant difference less than 0.3% relative to indium phosphide.

2 Claims, 9 Drawing Figures

SEMICONDUCTOR LASER

BACKGROUND OF THE INVENTION

The present invention relates to the reduction of the oscillation threshold value of a semiconductor laser.

Ordinary semiconductor lasers often employ a double hetero-structure, that is, such a structure that an active layer, which contributes to light emission, is sandwiched between semiconductor layers of larger energy gap and lower refractive index than those of the active layer. This is intended to aim at the effect of reducing the oscillation threshold value by confining both injected carriers and light to the vicinity of the active layer to thereby promote the interaction of guided light and the carriers. However, conventional semiconductor lasers have defects, such as overflowing of injected carriers over the hetero barries and very complex control for crystal growth.

SUMMARY OF THE INVENTION

An object of the present invention is to provide a semiconductor laser which has solved the problem of carrier leakage or the difficulty in crystal growth without impairing the effect of the reduction of the threshold current density.

To attain the above object of the present invention, there is provided a semiconductor laser in which first and second semiconductor layers of different conductivity types are formed as clad layers on both sides of a light emitting region in contact therewith, characterized in that the first and second semiconductor layers are each formed by alternately laminating pluralities of two or more kinds of semiconductor thin film layers of different refractive indexes and having a thickness less than 0.03 μm.

BRIEF DESCRIPTION OF THE ACCOMPANYING DRAWINGS

The present invention will be described in detail below in comparison with conventional art with reference to the accompanying drawings, in which.

DETAILED DESCRIPTION

To make differences between conventional art and the present invention clear, conventional art will first be described.

Figure 1:
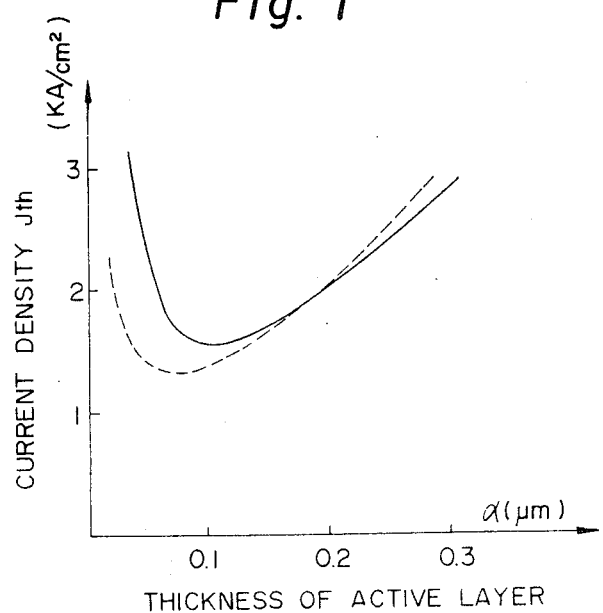
FIG. 1 is a graph showing a relation between an oscillation threshold current density $J_{th}$ and a thickness d of an active layer.

By the way, the oscillation threshold current density $J_{th}$ of the semiconductor laser decreases with the decrease in the thickness d of the active layer, but it abruptly increases as shown in FIG. 1 when the thickness d becomes smaller than a value of about 0.1 μm. The reason for this is that as the thickness d descreses, the light mostly leaks out of the active layer, resulting in a lowered ratio $\Gamma$ of the guided light present in the active layer (which ratio will hereinafter be referred to as the optical confinement factor). To prevent the abrupt increase of the current density $J_{th}$, it is necessary to increase the optical confinement factor $\Gamma$. One solution to this problem is such a structure that a semiconductor of an energy gap and a refractive index intermediate between those of the active layer and the clad layer is formed therebetween, instead of forming a homogeneous clad layer on either side of the active layer (see, for instance, IEEE Journal of Quantum Electronics, vol. QE-17, No. 7, pp. 1245-1250, 1981).

This structure will hereunder be described in connection with an InGaAsP laser.

Figure 2C:
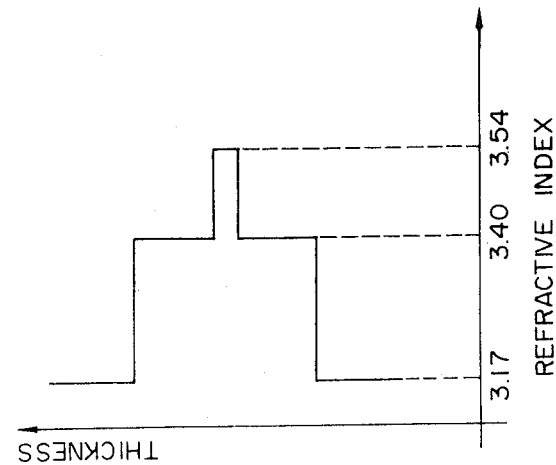
FIGS. 2B and 2C are graphs respectively showing distributions of a gallium composition and a refractive index in the vicinity of the active layer of a laser.
Figure 2B:
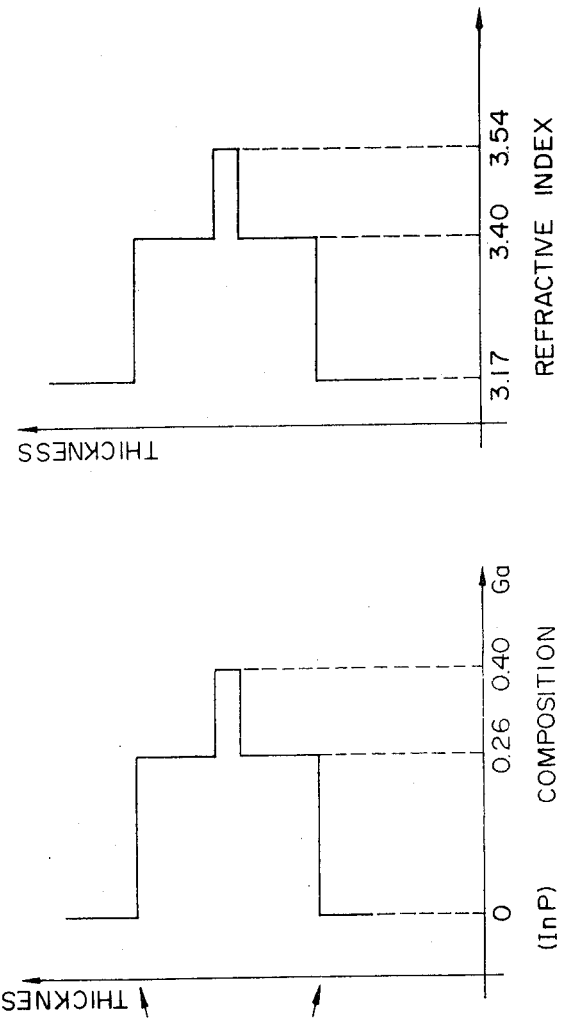
Figure 2A:
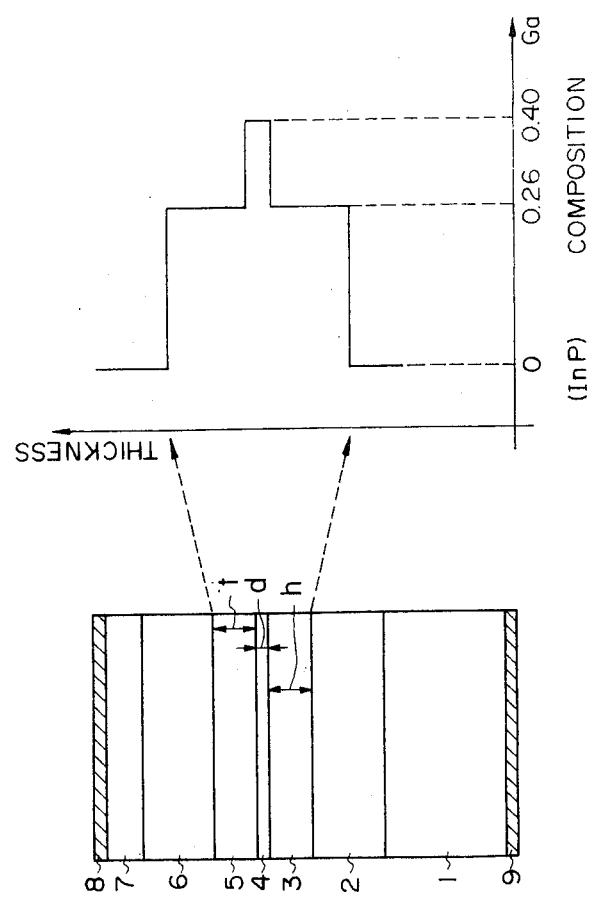
FIG. 2A is a cross-sectional view of a conventional InGaAsP laser.
Figure 3:
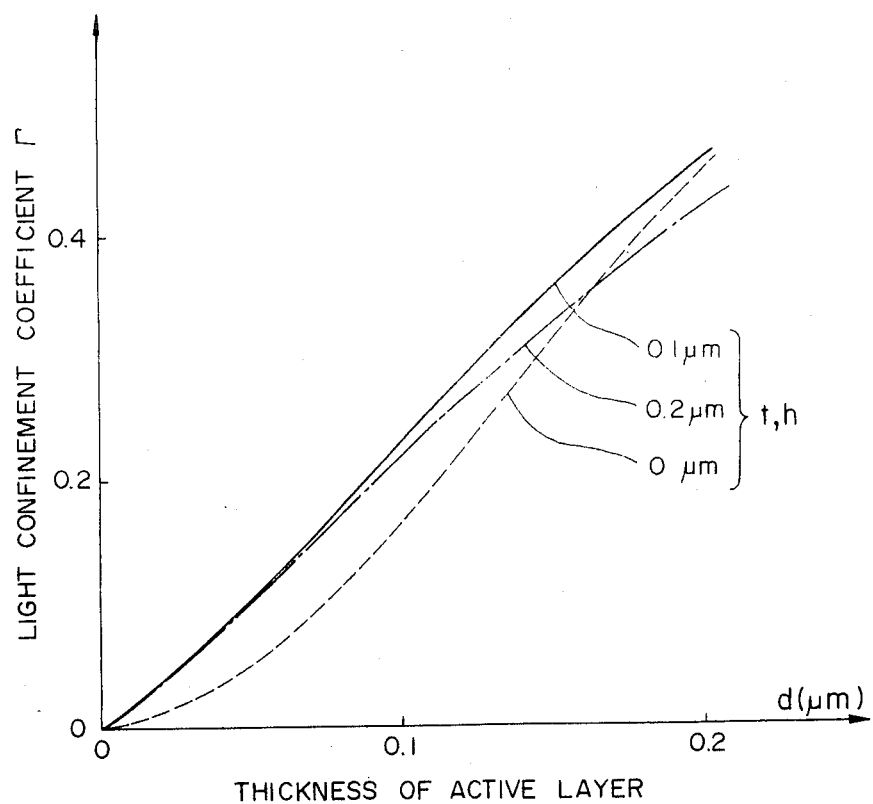
FIG. 3 is a graph showing a relation between a thickness d of an active layer and an optical confinement factor $\Gamma$.

FIG. 2A is a cross-sectional view showing the layer structure of the laser. Reference numeral 1 indicates an n-type InP substrate; 2 designates an n-type InP clad layer; 3 identified an n-type InGaAsP optical wave-guide layer (of a thickness h) in which the wavelength corresponding to the energy gap (hereinafter referred to simply as $\lambda_g$) is 1.3 μm; 4 denotes a non-doped InGaAsP active layer (of a thickness d) with $\lambda_g$ being 1.55 μm; 5 represents a p-type InGaAsP optical wave-guide layer (of a thickness t) with $\lambda_g$ being 1.3 μm; 6 shows a p-type InP clad layer; 7 refers to a p-type InGaAsP layer ($\lambda_g$=1.3 μm); and 8 and 9 signify electrodes. FIGS. 2B and 2C show the distributions of the gallium composition and the refractive index in the portion of the layers 3, 4 and 5 in the thickwise direction thereof. FIG. 3 shows the relation between the thickness d of the active layer and the optical confinement factor $\Gamma$ when the thicknesses t and h (t=h) of the layers 3 and 5 are changed to 0, 0.1 and 0.2 μm. With the thickness d smaller than approximately 0.1 μm, when the layers 3 and 5 are 0.1 or 0.2 μm, the optical confinement factor $\Gamma$ is larger than in the absence of the layers 3 and 5, that is, when t=h=0. On the other hand, the laser oscillation threshold current density $J_{th}$ by the Fabry-Perot oscillation is given by $$J_{th} = \frac{d}{A} \cdot \left[ \alpha_{in} + \alpha_{ac} + \alpha_{ex} \frac{1-\Gamma}{\Gamma} + \frac{\ln(1/R)}{L \cdot \Gamma} \right]^2 \quad (1)$$

where A is a constant, L is the length of the laser, R is an end face reflectivity and $\alpha_{ac}$, $\alpha_{ex}$ and $\alpha_{in}$ are constants representing a loss in the active layer, a loss outside it and an effective loss, respectively. Now, consider the current density $J_{th}$ when the thickness d of the active layer and the length L of the laser are held constant and only the thicknesses h and t of the layers 3 and 5 are changed. In Eq. (1), the optical confinement factor $\Gamma$ undergroes a substantial change but the other values hardly change. That is, it may be considered that the current density $J_{th}$ in this equation depends only on the optical confinement factor $\Gamma$. Accordingly, in a case where the thickness d of the active layer is smaller than a value of about 0.1 μm, the threshold current density is reduced by forming the layers 3 and 5 to a thickness in the range of 0.1 to 0.2 μm. For Example, in FIG. 1, the solid line shows the case of the layer 3 and 5 being not formed and the broken line the case of the layers 3 and 5 being formed to a thickness of 0.1 μm. As will be appreciated from the above, the lowest threshold current density can be reduced by the insertion of the layers 3 and 5.

Figure 4C:
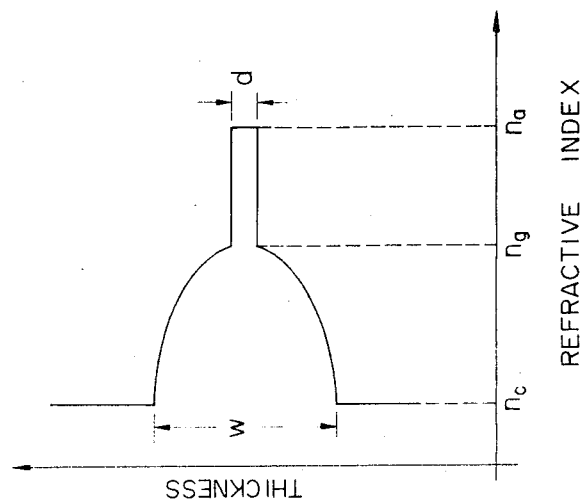
FIGS. 4B and 4C are graphs respectively showing distributions of a gallium composition and a refractive index of a laser in the vicinity of an active layer thereof.
Figure 4B:
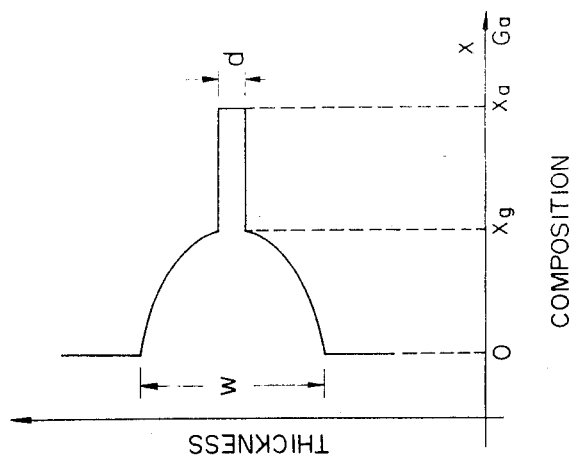
Figure 4A:
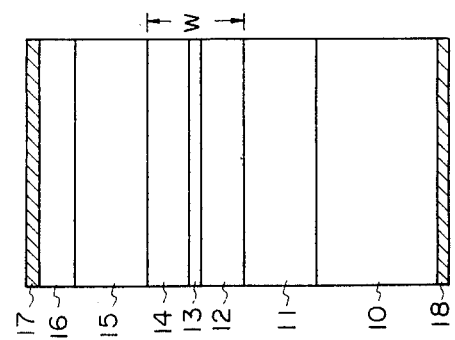
FIG. 4A is a cross-sectional view of a laser of a structure in which layers of continuously varying index are formed on both sides of an active layer.

A structure very similar to the above-described has been proposed in which a layer of continuously varying energy gap and refractive index is formed on either side of the active layer (see Applied Physics Letters, vol. 39, No. 2, pp. 134–137, 1982). This structure will hereinbelow be described with respect to an InGaAsP laser. FIG. 4A is a cross-sectional view showing the layer structure of an $In_{1-x}Ga_xAs_yP_{1-y}$/InP laser. Reference numeral 10 indicates an n-type InP substrate; 11 designates an n-type InP clad layer; 12 identifies an n-type InGaAsP optical wave guide layer the gallium composition x of which continuously varies between values 0 and $x_g$; 13 denotes a non-doped InGaAsP active layer ($x=x_a$); 14 represents a p-type InGaAsP optical wave guide layer the gallium composition x of which continuously varies between values $x_g$ and 0; 15 shows a p-type InP clad layer; 16 refers to a p-type InGaAsP layer; and 17 and 18 signify electrodes. FIGS. 4B and 4C respectively show the distributions of the gallium composition x and the refractive index in the portion of the layers 12, 13 and 14 in the thickwise direction thereof. In the absence of the layers 12 and 14, when the thickness of the active layer 13 is smaller than about 0.1 μm, the threshold current density increases with a decrease in the thickness of the active layer as mentioned previously but, in the presence of the optical wave guide layers 12 and 14 the refractive indexes of which undergo continuous variations as shown in FIG. 4, the abrupt increase in the threshold current density is alleviated, resulting in the reduction of the lowest threshold current density.

However, the foregoing discussion does not take the energy band structure into account. With the two structures described above, an energy difference between the active layer and the layers formed in contact therewith on both sides thereof (the layers 3 and 5 in FIG. 2 and the layers 12 and 14 in FIG. 4) is smaller than that in the case of the ordinary double hetero-structure. On account of this, it is very likely that injected carriers overflow the hetero barriers into the layers on the both sides. This rather produces the effect of raising the threshold current density, and this effect becomes marked as temperature rises. This is particularly remarkable in the InGaAsP laser. Further, in the latter of the above-described two structures, it is necessary to form the layers of continuously varying compositions, but very complex control is needed for performing crystal growth with continuously varying composition while maintaining lattice matching.

A description will be given of examples of the semiconductor laser embodying the present invention.

EXAMPLE 1

Figure 5:
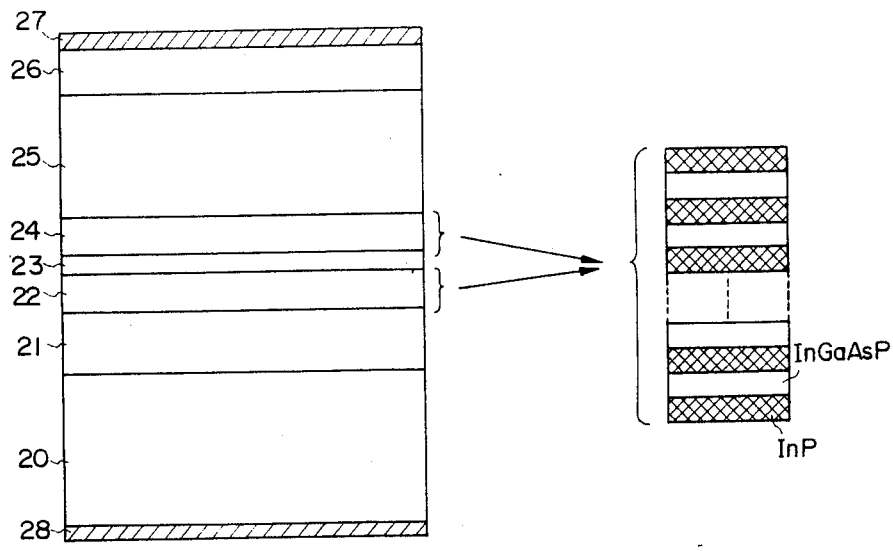
FIG. 5 is a cross-sectional view illustrating an embodiment of the present invention.

FIG. 5 illustrates an example in cross section, layers 22 and 24 being shown on an enlarged scale at the right-hand side. Reference numeral 20 indicates an n-type InP substrate; 21 designates an n-type InP clad layer; 22 identifies an optical wave guide layer formed by alternately laminating large numbers of n-type InP and n-type InGaAsP ($\lambda_g=1.55$ μm) layers, each having a thickness of less than 0.03 μm; 23 denotes a non-doped InGaAsP active layer with $\lambda_g=1.55$ μm; 24 represents an optical wave guide layer formed by alternately laminating large numbers of p-type InP and p-type InGaAsP ($\lambda_g=1.55$ μm) layers, each being less than a thickness of 0.03 μm; 25 shows a p-type InP clad layer; 26 refers to a p-type InGaAsP layer ($\lambda_g=1.3$ μm); and 27 and 28 signify electrodes. In this case, for analyzing the light propagation in such a structure as shown in FIG. 5, it is necessary to solve the Maxwell equation for each layer in a manner to satisfy boundary conditions. Approximately, however, the analysis can be made regarding each of the layers 22 and 24 as a homogeneous layer (see, for example, Applied Physics, vol. 18, No. 21, pp. 3547–3548, 1979). That is, assuming that each layer is formed by alternately laminating layers of a refractive index $n_1$ and a thickness $t_1$ and layers of a refractive index $n_2$ and a thickness $t_2$, and that the numbers of the layers are N and (N+1), respectively, the layer can be regarded approximately as a layer the thickness $\bar{t}$ of which is given by $$\bar{t}=N\cdot t_1+(N+1)t_2 \qquad (2)$$

and the refractive index $\bar{n}$ of which is given by $$\bar{n} = \frac{N\cdot t_1 \cdot n_1 + (N+1)\cdot t_2 \cdot n_2}{\bar{t}} \qquad (3)$$

For example, the refractive indexes of the InP and InGaAsP ($\lambda_g=1.55$ μm) at the wavelength 1.55 μm are 3.17 and 3.54, respectively, so that in a case where fourteen InP layers of 0.005 μm thickness and thirteen InGaAsP layers ($\lambda_g=1.55$ μm) of 0.009 μm thickness are alternately laminated, $\bar{t}=0.187$ μm and $\bar{n}=3.401$; this can be regarded as equivalent to the formation of an InGaAsP layer ($\lambda_g=1.30$ μm and the refractive index = 3.40) having a thickness of 0.187 μm. Further, by changing N, $t_1$, $n_1$, $t_2$ and $n_2$, values $\bar{t}$ and $\bar{n}$ can also be properly set. That is, in the structure of FIG. 5, since the layers formed in contact with the active layer 23 are InP layers, the value of the energy barrier as viewed from the active layer is large than that in the case of the structure of FIG. 2. Accordingly, this example ensures increase of the optical confinement factor while preventing the carrier leakage.

EXAMPLE 2

Next, another example will be described. In Example 1 the thicknesses of the layers alternately laminated to form each of the layers 22 and 24 were selected to be equal to one another for the same composition. In Example 2 the layer thicknesses are varied in dependence upon the layers remoteness from the active layer. For example, in a case where the thickness of the InP layer of each of the layers 22 and 24 is held constant at 0.005 μm but the thickness of the InGaAsP layer ($\lambda_g=1.55$ μm) are successively reduced by steps of 0.009 to 0.005 μm as the layers are removed in distance from the active layer, the layers 22 and 24 can each be regarded approximately as a 0.18 μm thick layer the refractive index of which varies from 3.40 to 3.17. That is, by laminating layers of different thicknesses, it is possible to fabricate a layer of varying refractive index which is similar to the layer shown in FIG. 4. In general, control for simply laminating a number of layers of different thicknesses is easier than for continuously changing the composition while maintaining lattice matching. Moreover, as is the case with Example 1, the height of the energy barrier as viewed from the active layer is larger than that in the case of FIG. 4. As described above, according to this Example, a waveguide structure which is equivalent to a waveguide of continuously varying refractive index but preventing the carrier leakage can be obtained; therefore, the oscillation threshold current density can be reduced relatively easily.

While in Examples 1 and 2 two kinds of semiconductor layers are laminated, three or more kinds of semiconductor layers may also be laminated. Further, the present invention has been described as being applied to a laser of the type that an electrode is deposited over the entire area of each wafer surface, the invention is also applicable to lasers of various structures for lateral mode control, including a buried heterostructure. Moreover, the present invention is applicable to a laser provided with an axial mode control mechanism, such as a distributed feedback or distributed Bragg reflection laser of the type in which periodic corrugation are formed in the direction of optical wave guide. Besides, although in the above-mentioned examples the active layer has been described as a layer of uniform composition, the present invention can also be applied, for instance, to a laser in which the active layer is replaced by a structure in which thin (less than 0.03 μm) layers of different energy gaps are laminated, that is, what is called a quantum well structure laser.

The examples have been described in connection with the InGaAsP laser for the sake of brevity, but the present invention is also applicable to mixed crystals, such as AlGaAs, InGaAlAs, InGaAlP and so forth.

As has been described in the foregoing, according to the present invention, the reduction of the leakage of carriers crossing over the hetero-barrier and an increase in the optical confinement factor can be achieved simultaneously, and this permits further reduction of the laser oscillation threshold current density; therefore, the present invention is of great utility.

What is claimed is:

1. In a semiconductor laser in which first and second semiconductor layers of different conductivity types are formed as clad layers on both sides of a light emitting region in contact therewith, the improvement comprising the first and second semiconductor layers each formed by alternately laminating pluralities of two or more kinds of semiconductor thin film layers of different refractive indexes and having a thickness less than 0.03 μm and the thickness of the thin film layer of at least one kind of the semiconductor thin film layers of a thickness less than 0.03 μm varies in dependence upon their remoteness from the light emitting region.

2. In a semiconductor laser according to claim 1, in which the light emitting region and the first and second semiconductor layers are each formed of a mixed crystal which consists of indium, gallium, arsenic and phosphorous, or indium, gallium, alminum and arsenic and which has a lattice constant difference less than 0.3% relative to indium phosphide.

* * * * *